US011137812B2

(12) United States Patent
Gelman et al.

(10) Patent No.: US 11,137,812 B2
(45) Date of Patent: Oct. 5, 2021

(54) METHOD AND APPARATUS FOR IMPROVING INTEGRITY OF PROCESSOR VOLTAGE SUPPLY WITH SUPPORT FOR DVFS

(71) Applicant: Chaoyang Semiconductor Jiangyin Technology Co., Ltd., Jiangyin (CN)

(72) Inventors: Anatoly Gelman, San Diego, CA (US); Taner Dosluoglu, New York, NY (US)

(73) Assignee: Chaoyang Semiconductor Jiangyin Technology Co., Ltd., Jiangyin (CN)

( * ) Notice: Subject to any disclaimer, the term of this patent is extended or adjusted under 35 U.S.C. 154(b) by 379 days.

(21) Appl. No.: 16/286,041

(22) Filed: Feb. 26, 2019

(65) Prior Publication Data

US 2019/0265769 A1 Aug. 29, 2019

Related U.S. Application Data

(60) Provisional application No. 62/635,322, filed on Feb. 26, 2018.

(51) Int. Cl.
| | |
|---|---|
| *G05F 1/00* | (2006.01) |
| *G06F 1/30* | (2006.01) |
| *H03H 7/06* | (2006.01) |
| *H03K 5/01* | (2006.01) |
| *H03K 5/08* | (2006.01) |

(52) U.S. Cl.
CPC ............ *G06F 1/305* (2013.01); *H03H 7/06* (2013.01); *H03K 5/01* (2013.01); *H03K 5/086* (2013.01)

(58) Field of Classification Search
CPC .......... G06F 1/305; G06F 1/28; H03K 5/086; H03K 5/01; H03H 7/06; H03H 7/0153

USPC ........................................................ 323/272
See application file for complete search history.

(56) References Cited

U.S. PATENT DOCUMENTS

| | | | |
|---|---|---|---|
| 2009/0091378 A1* | 4/2009 | Haridass | G06F 1/28 327/554 |
| 2010/0121897 A1* | 5/2010 | Bal | H03H 17/0286 708/313 |
| 2016/0352219 A1* | 12/2016 | Amgad Abdulslam | H02M 3/07 |
| 2017/0261537 A1* | 9/2017 | Chong | G01R 31/3004 |

FOREIGN PATENT DOCUMENTS

WO   WO 2014-166537 A1   10/2014

OTHER PUBLICATIONS

International Search Report on related PCT Application No. PCT/US2019/019645 from International Searching Authority (KIPO) dated Jul. 2, 2019.
Written Opinion on related PCT Application No. PCT/US2019/019645 from International Searching Authority (KIPO) dated Jul. 2, 2019.

* cited by examiner

*Primary Examiner* — Ryan Jager
(74) *Attorney, Agent, or Firm* — Klein, O'Neill & Singh, LLP

(57) ABSTRACT

Dedicated circuitry may monitor a processor supply voltage and provide additional power on a temporary nano-second scale basis to the processor when the supply voltage drops below predetermined levels. This may be done without explicit knowledge of a commanded supply voltage level for the processor.

18 Claims, 19 Drawing Sheets

| SENSOR | CONDITION AND OUTPUT INDICATION |
|---|---|
| Droop sensor #0 | Vin < Vdrp0:     THRESHOLD #0 TRIP |
| | Vin > Vdrp0:     THRESHOLD #0 NO-TRIP |
| | Vin close to Vdrp0: THRESHOLD #0 TRIP or NO-TRIP |
| Droop sensor #1 | Vin < Vdrp1:     THRESHOLD #1 TRIP |
| | Vin > Vdrp1:     THRESHOLD #1 NO-TRIP |
| | Vin close to Vdrp1: THRESHOLD #1 TRIP or NO-TRIP |
| Droop sensor #2 | Vin < Vdrp2:     THRESHOLD #2 TRIP |
| | Vin > Vdrp2:     THRESHOLD #2 NO-TRIP |
| | Vin close to Vdrp2: THRESHOLD #2 TRIP or NO-TRIP |
| Zero Crossing sensor | Vin > Vzc: :    TREAT ALL DROOP SENSOR INDICATIONS AS NO-TRIP |
| | Vin < Vzc:     NO ACTION |
| | Vin close to Vzc: TREAT ALL DROOP SENSOR INDICATIONS AS NO-TRIP OR NO ACTION |

FIG. 9

METHOD AND APPARATUS FOR IMPROVING INTEGRITY OF PROCESSOR VOLTAGE SUPPLY WITH SUPPORT FOR DVFS

CROSS REFERENCE TO RELATED APPLICATION

This application claims the benefit of the filing date of U.S. Provisional Patent Application No. 62/635,322, filed on Feb. 26, 2018, the disclosure of which is incorporated by reference herein.

BACKGROUND OF THE INVENTION

Aspects of the invention relate to voltage regulation for semiconductor devices, and more particularly to mitigating voltage droops in a regulated voltage supply for semiconductor devices.

Reliable continuous operation of a high-performance processor, for example a CPU or GPU (processor) often depends on integrity of a voltage supply to its processing circuitry. For example, during sudden onset of a processor's operational activity (which may be referred to as load step transient, load step event, or transient event), the supply voltage may temporarily droop. Often a transient-related voltage margin may be utilized in a power supply design to account for transient voltage droops, to attempt to ensure reliable continuous operation of the processor at its chosen operating frequency.

An active transient control block may be used to reduce voltage droops. An active transient control block generally includes circuitry for providing additional power to a load on the occurrence of a negative transient change in supplied voltage. Use of an active transient control block may relax transient-related voltage margin requirements, thus effectively providing a useful voltage credit which can be used to increase a processor's operating frequency, and/or reduce a processor's power consumption, and/or increase manufacturing yield at higher operating frequency, and/or reduce Processor's silicon area. PUBLISHED PAPER: H. Mair, et al., "A 10 nm FinFET 2.8 GHz Tri-Gear Deca-Core CPU Complex with Optimized Power-Delivery Network for Mobile SoC Performance", ISSCC, p. 56-57, 2017, the disclosure of which is incorporated by reference herein.

However, processors may be configured to operate at different voltage levels. In some cases the voltage levels may be set statically, for example depending on a system in which the processor is configured to operate. In some cases the voltage levels instead or in addition may be dynamically changed during operation, for example due to dynamic voltage and frequency scaling (DVFS) operations. In either case, circuitry preconfigured to account for transient voltage droops may have difficulties in being able to properly respond in the case of differing desired voltage level of the processor.

BRIEF SUMMARY OF THE INVENTION

Some embodiments provide an apparatus and/or method for mitigation of supply voltage droops. Some embodiments provide for automatic transient control responses without predetermined knowledge of a processor's voltage target. In some embodiments an active transient control block is agnostic to a processor's voltage target. In some embodiments the active transient control block is independent of DVFS implementations and/or commands. In some embodiments the active transient control block is agnostic to DVFS implementations and/or commands. Some embodiments provide voltage droop responses with sub-nanosecond response times.

Some embodiments provide circuitry for compensating for voltage droop in power supplied to a load, comprising: a first low pass filter with a first time constant configured to filter a signal indicative of voltage provided to the load to provide a first low pass filtered signal; a second low pass filter with a second time constant configured to filter the signal indicative of voltage provided to the load to provide a second low pass filtered signal, the second time constant less than the first time constant; an offset generator configured to generate at least one voltage level that is a percentage of the first low pass filtered signal indicative of voltage provided to the load; a first sensor configured to determine that the second low pass filtered signal is less than the at least one voltage level; and control circuitry configured to activate at least one switch coupling a higher voltage source supply to the load in response to the first sensor determining that the second low pass filtered signal is less than the at least one voltage level.

Some embodiments provide a method of compensating for voltage droop in power supplied to a load, comprising: determining that a signal indicative of voltage supplied to the load, to provide power to the load, is less than at least one predetermined percentage of a delayed version of the signal indicative of voltage supplied to the load; in response to determining that the signal indicative of voltage supplied to the load is less than the at least one predetermined percentage of the delayed version of the signal indicative of voltage supplied to the load, coupling a higher voltage source supply to a higher level voltage rail providing power to the load.

These and other aspects of the invention are more fully comprehended upon review of this disclosure.

BRIEF DESCRIPTION OF THE FIGURES

FIG. 9 is a table indicating example output settings for droop sensors in accordance with aspects of the invention.

DETAILED DESCRIPTION

Figure 1:
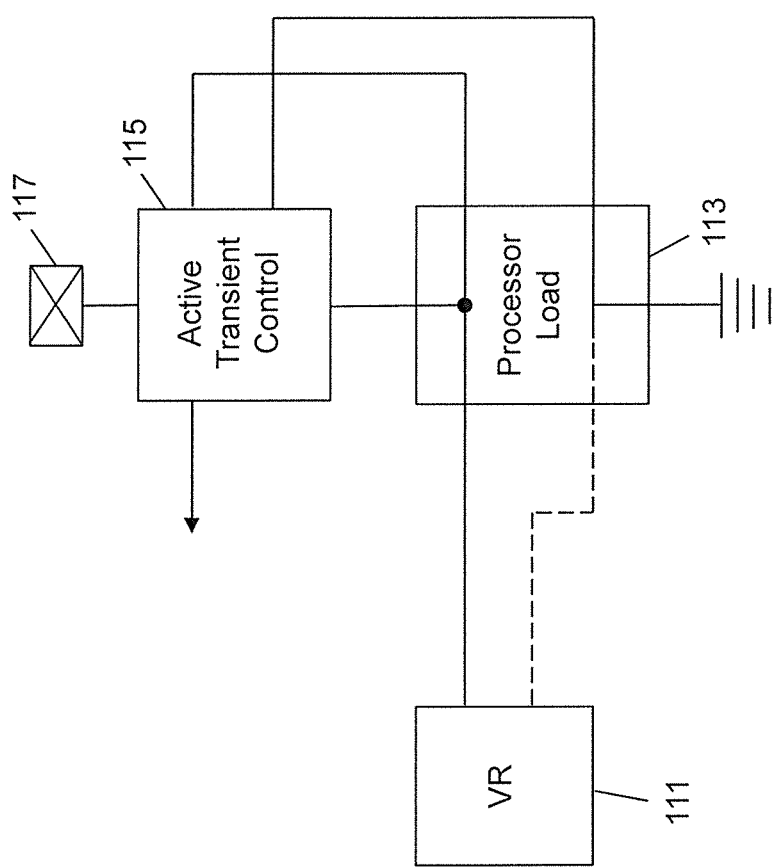
FIG. 1 is a block diagram of a voltage regulation system for a load including an active transient control (ATC) block in accordance with aspects of the invention.

FIG. 1 is a block diagram of a voltage regulation system for a load including an active transient control (ATC) block in accordance with aspects of the invention. In the embodiment of FIG. 1, a voltage regulator 111 provides power to a processor load 113. In most embodiments the load comprises semiconductor circuitry, and may be for example a processor, processor core, CPU cluster or other semiconductor logic circuitry. The voltage regulator may be, for example, a DC-DC switching converter, and the voltage regulator may be in a buck configuration, a boost configuration, a buck-boost configuration, or some other configuration. In some embodiments the semiconductor circuitry is that of a handheld device, for example a smartphone, with the voltage regulator regulating power provided by a battery. To conserve battery power, and for other reasons, in various embodiments a desired voltage level for the load may vary dynamically, for example as determined and commanded from time-to-time by a dynamic voltage and frequency scaling block (not shown).

Power drawn by the load may also vary substantially over time, depending on activity of the processor(s) making up the load. Moreover, the power drawn by the load may increase very quickly, over very few clock cycles. In such instances, the voltage provided to the load by the voltage regulator may suddenly drop, or exhibit a voltage droop, that may result in improper operation of the load.

Accordingly, the system of FIG. 1 includes an ATC block 115. The ATC block is coupled to a power source 117. The ATC block monitors for occurrence of a voltage droop, and provides additional power from the power source to the load in the detected event of a voltage droop. Moreover, the ATC block of FIG. 1 does so without being provided a signal indicative of a commanded voltage level for power supplied to the load. As illustrated in FIG. 1, the ATC block provides the additional power to the load in parallel to the power provided to the load by the voltage regulator.

Figure 2:
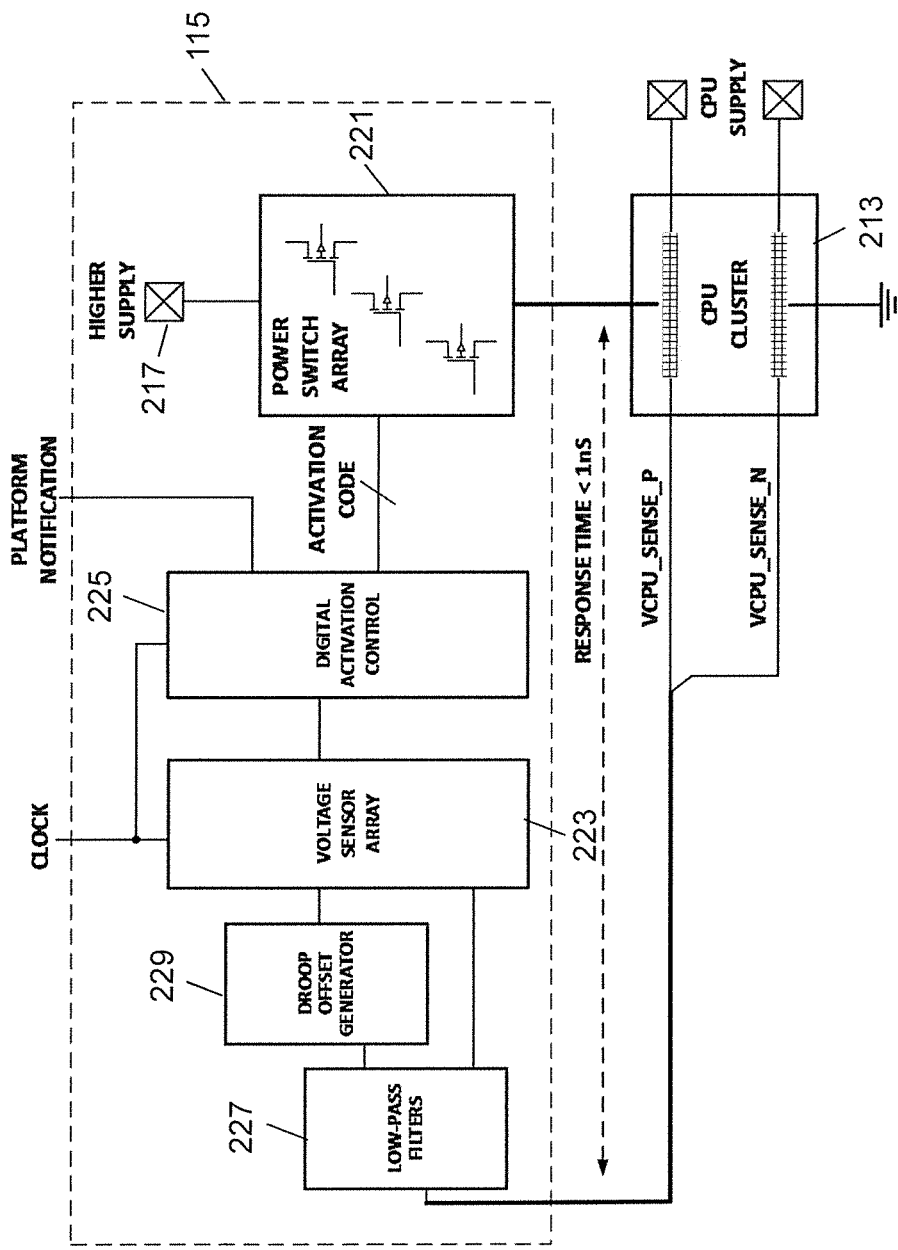
FIG. 2 is a block diagram of an embodiment of an ATC block coupled to a load, in accordance with aspects of the invention.

FIG. 2 is a block diagram of an embodiment of an ATC block 115 coupled to a load, in accordance with aspects of the invention. The ATC block receives sense signals indicating voltage of power rails of the load, with the load being shown as a CPU cluster. In some embodiments, and as illustrated in FIG. 2, the power rails include a lower level voltage rail at ground, and a higher level voltage rail above ground. As one would understand, in various implementations the lower level voltage rail may not be at ground, with the lower level voltage rail being simply at some voltage lower than the higher level voltage rail. In some embodiments the ATC block is coupled directly to the power rails, in some embodiments the ATC block receives signals at a voltage equal to the voltage levels of the rails, or a scaled version of the voltage levels of the rails.

Low-pass filters 227 of the ATC block receive the sense signals indicating voltage levels of the rails. The low-pass filters provide voltage signals to a droop offset generator 229 and a voltage sensor array 223. In various embodiments the low-pass filters serve to provide a delay, programmable in some embodiments, to the voltage signals provided to the droop offset generator and the voltage sensor array. In some embodiments the voltage signal to the droop offset generator is delayed by an amount greater than the voltage signal to the voltage sensor array. In some embodiments only one low-pass filter is used, for the signal to be provided to the droop offset generator.

The droop offset generator generates one or more voltage levels believed to be indicative of a droop detection thresholds. The droop offset generator generates the voltage levels based on the voltage signal provided by the low-pass filters. In some embodiments the one or more voltage levels believed to be indicative of droop detection thresholds are fixed percentages of the voltage signal provided by the low-pass filters. In some embodiments the one or more voltage levels believed to be indicative of droop detection thresholds are programmable percentages of the voltage signal provided by the low pass filters.

The voltage sensor array compares the voltage signal from the low-pass filters with the one or more voltage levels believed to be indicative of droop detection thresholds. As indicated above, in some embodiments the voltage signal provided to the droop offset generator is delayed for a greater amount of time than the voltage signal provided to the voltage sensor array. Accordingly, even though the low-pass filters provide signals to both the droop offset generator and the voltage sensor array, in such embodiments a drop in voltage of power supplied to the CPU cluster will be exhibited as a drop in voltage in the voltage signal provided to the voltage sensor array prior to a corresponding decrease in output of the droop offset generator. The voltage sensor array, therefore, determines if voltage supplied to the load exhibits a drop in voltage below the voltage levels believed to be indicative of voltage droop.

Results of the comparisons performed by the voltage sensor array are provided to a digital activation control block 225. The digital activation control block creates an activation code based on the results of the comparisons performed by the voltage sensor array. In some embodiments the activation code is provided by the digital activation control block on a plurality of signal paths, for example with one bit of the activation code provided on each of the plurality of signal paths.

A power switch array 221 receives the digital activation code. Based on the digital activation code the power switch array activates none, one or a plurality of switches to provide power from a higher voltage source supply 217 to the CPU cluster, for example by coupling the higher voltage source supply to the higher level voltage rail by way of the activated switches. In some embodiments the power switch array includes a plurality of switches in parallel coupling the higher voltage source supply to the CPU cluster. In some embodiments different ones of the paths are configured to provide different amount of power to the CPU cluster. In some embodiments each of the paths are configured to provide the same amount of power to the CPU cluster. In some embodiments the power switch array is as discussed in U.S. Pat. No. 9,515,553, the disclosure of which is incorporated herein in its entirety. In some embodiments the power switches are implemented in banks of power switches, and the different banks of power switches may be located in different areas of a semiconductor. For example, in some embodiments one bank of power switches may be located on one side of circuitry for the droop offset generator, voltage sensors, and digital control, and one bank of power switches may be located on an opposing side of the circuitry for the droop offset generator, voltage sensors, and digital control. In some embodiments each of the power switches share a same trimming code.

Figure 3:
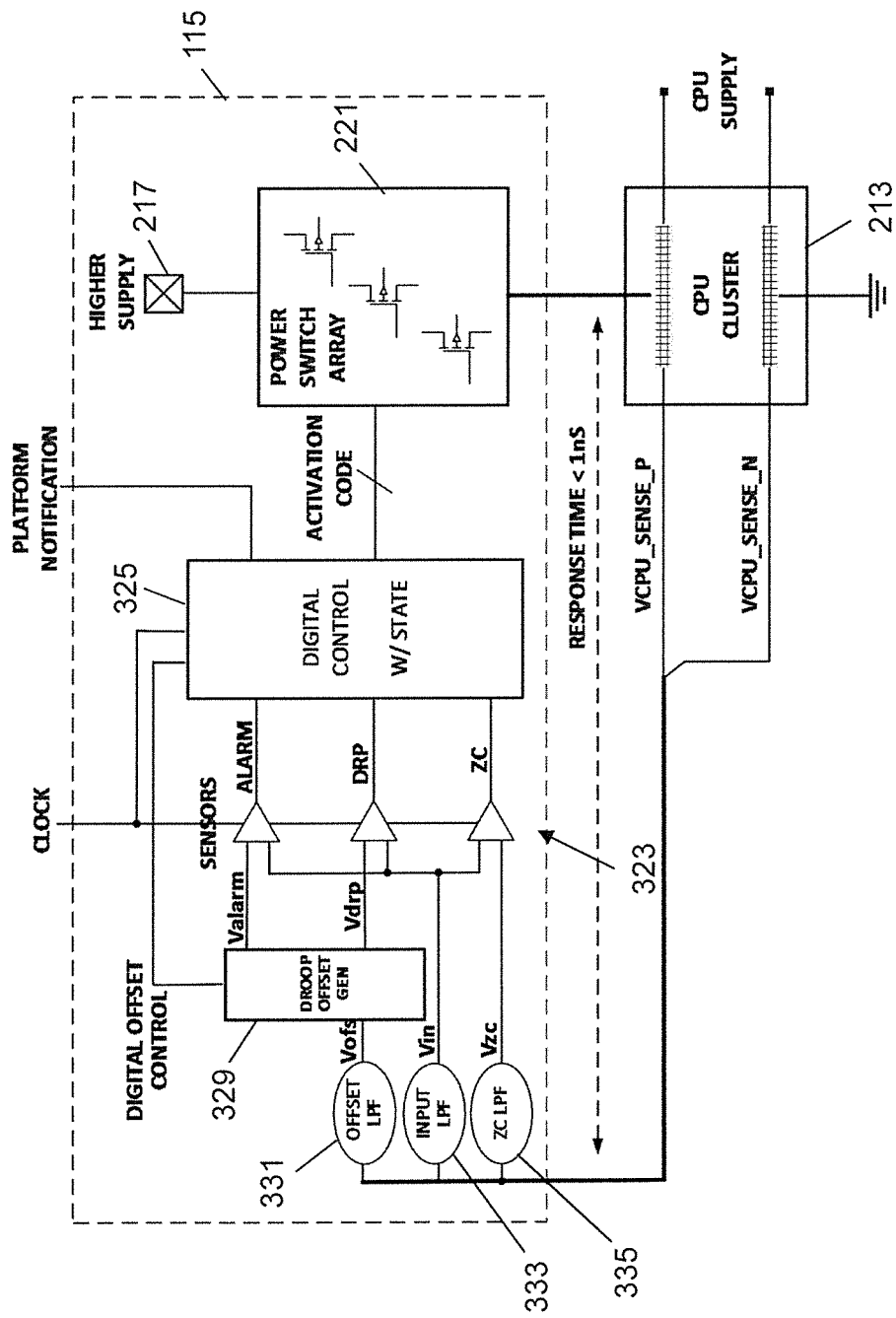
FIG. 3 is a block diagram of a further embodiment of an ATC block coupled to a load, in accordance with aspects of the invention, with the further embodiment showing an example of low pass filters and the voltage sensor array of the ATC block of FIG. 2.

FIG. 3 is a block diagram of a further embodiment of an ATC block coupled to a load, in accordance with aspects of the invention, with the further embodiment showing an example of low-pass filters and the voltage sensor array of the ATC block of FIG. 2. The embodiment of FIG. 3, like the embodiment of FIG. 2, shows a CPU cluster 213 with a power rail coupled to an ATC block 115. A power switch array 221 of the ATC block couples a voltage supply source 217 to the power rail of the CPU cluster.

The ATC block of the embodiment of FIG. 3 includes an offset low-pass filter 331, an input low-pass filter 333, and a zero crossing low-pass filter 335. The offset low-pass filter provides a filtered voltage signal Vofs to a droop offset generator 329, with the droop offset generator generating an alarm threshold signal Valarm and a droop threshold signal Vdrp. In some embodiments the Valarm signal is set to a voltage greater than the voltage of the Vdrp signal. In some embodiments, however, the Valarm signal is set to a voltage less than the voltage of the Vdrp signal. The input low-pass filter provides a filtered voltage signal Vin, which is compared to the Valarm and Vdrp threshold signals by voltage sensors 323. The zero crossing low-pass filter provides a zero crossing threshold signal Vzc, which is compared to the filtered signal Vin by voltage sensors 323.

In some embodiments the low-pass filters are implemented using RC circuits. In some embodiments the low-pass filters have programmable time constants. In some embodiments the time constant of the input low-pass filter is less than the time constants of the offset low-pass filter and/or the zero crossing low-pass filter. In some embodiments the time constant of the input low-pass filter is between 0-0.5 nanoseconds. In some embodiments the time constant of the zero crossing low-pass filter is between 0.5-5 nanoseconds. In some embodiments the time constant of the offset low-pass filter is between 10-100 nanoseconds. In one embodiment the time constant of the input low-pass filter is 0.2 nanoseconds, the time constant of the zero crossing low-pass filter is 2 nanoseconds, and the time constant of the offset low-pass filter is 20 nanoseconds.

Results of the comparisons by the voltage sensors are provided to a digital control 325. The digital control sets an activation code commanding a number of switches of the power switch array to activate. In some embodiments the digital control sets the activation code to increase the number of active power switches, up to all of the power switches, for each clock cycle, or each of a number of programmable clock cycles, for a voltage droop situation, in which the voltage sensors indicate that the Vin signal is less than the Vdrp signal. In some embodiments the digital control sets the activation code to decrease the number of active power switches, up to all of the power switches, for each clock cycle, or each of a number of programmable clock cycles, for a no voltage droop situation in which the voltage sensors indicate that the Vin signal is not less than the Vdrp signal. In some embodiments the digital control also considers that a no voltage droop situation exists, regardless of whether the voltage sensors indicate a voltage droop situation, if the voltage sensors indicate that Vin is greater than Vzc, which would indirectly indicate that Vin is increasing. In some embodiments, for example embodiments in which Valarm is set higher than Vdrp, the digital control deactivates all of the power switches if the voltage sensors indicate an alarm condition, with Vin greater than Valarm. In some embodiments, however, for example embodiments in which Valarm is set lower than Vdrp, the digital control may provide a platform notification whenever Vin is less than Valarm. In some embodiments the platform notification may be in the form of a dedicated signal provided to a platform hosting the CPU cluster (or a system-on-chip SOC processor of the platform). In some embodiments the platform notification may be in the form of an interrupt signal to the platform.

In some embodiments, and as illustrated in FIG. 3, the digital control sets a digital offset control signal, used by the droop offset generator in setting the droop threshold signal Vdrp. In some embodiments the digital control sets the digital offset control signal to command use of a higher value for Vdrp, up to a predefined maximum value, for each cycle a droop situation exists. In some embodiments, the digital control offset signal is reset to command use of a minimum value for Vdrp, or simply a lower value, when the droop situation no longer exists.

Figure 4:
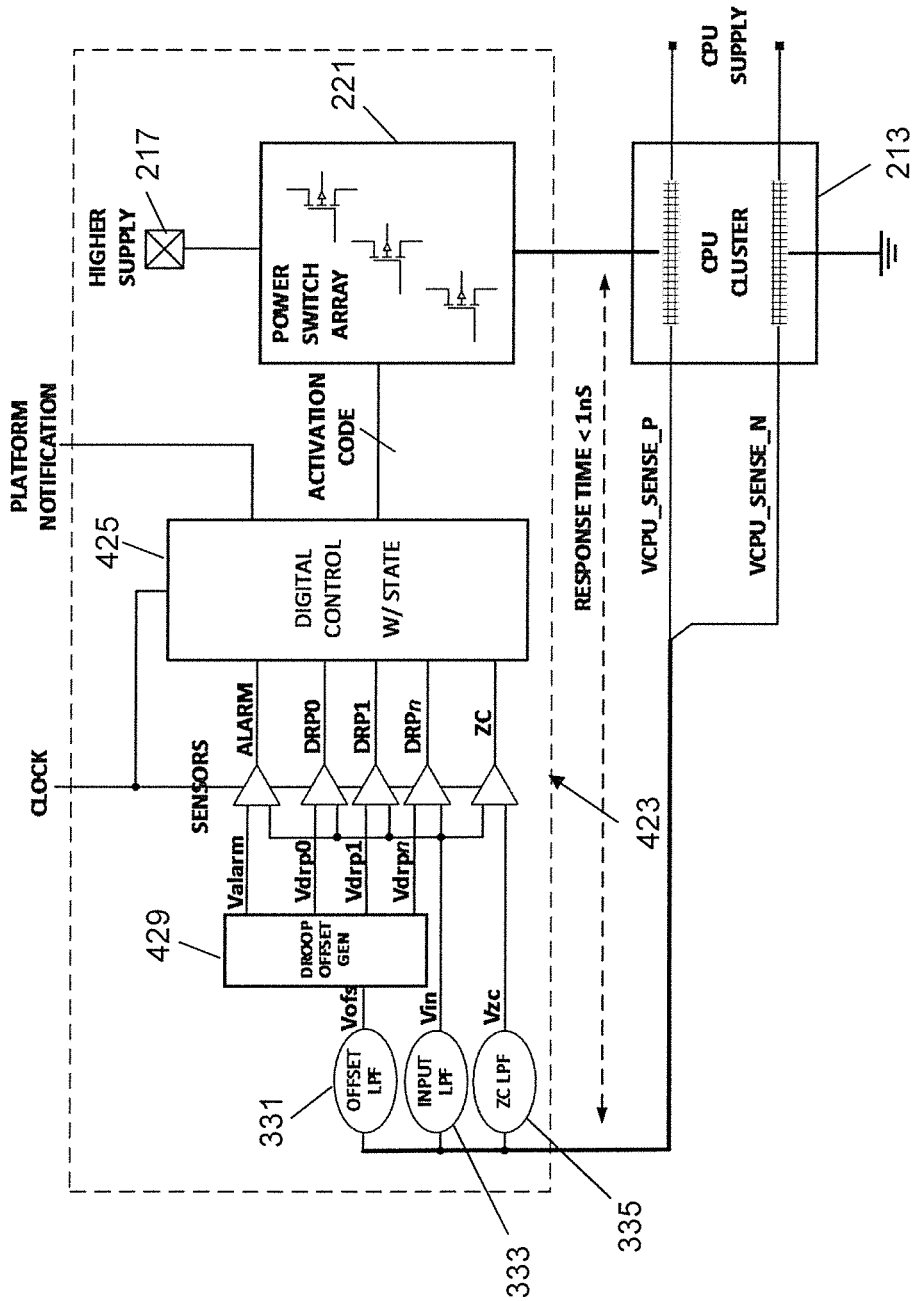
FIG. 4 is a block diagram of a further embodiment of an ATC block coupled to a load, in accordance with aspects of the invention, with the further embodiment showing a further example of the voltage sensor array of the ATC block of FIG. 2.

FIG. 4 is a block diagram of a further embodiment of an ATC block coupled to a load, in accordance with aspects of the invention, with the further embodiment showing a further example of the voltage sensor array of the ATC block of FIG. 2. The embodiment of FIG. 4 is similar to the embodiment of FIG. 3, with the embodiment of FIG. 4 including a plurality of voltage droop indications. The use of a greater number of droop indicators may provide for increased flexibility in responding to voltage droop situations, although the use of additional numbers of voltage sensors to do so may result in an increase in area of and power usage by the voltage sensors.

The embodiment of FIG. 4, like the embodiment of FIG. 2, shows a CPU cluster 213 with a power rail coupled to an ATC block. A power switch array 221 of the ATC block couples a voltage supply source 217 to the power rail of the CPU cluster. Like the embodiment of FIG. 3, embodiment of FIG. 4 includes an offset low-pass filter 331, an input low-pass filter 333, and a zero crossing low-pass filter 335, for example as discussed with respect to FIG. 3.

A droop offset generator 429 of FIG. 4, however, generates a plurality of droop threshold signals Vdrp0,Vdrp1 Vdrpn, in addition to a Valarm signal. Each of the plurality of droop threshold signals are at different voltage levels, with for example Vdrp0 being a higher voltage than Vdrp1, which is higher than Vdrp2, etc. Similarly, the voltage sensors compare Vin, from the input low-pass filter, with each of the droop signals, in addition to performing the Valarm and Vzc comparisons as discussed with respect to FIG. 3.

A digital control 425 sets an activation code for activating switches of the power switch array. In some embodiments the digital control sets the activation code based on the number of voltage sensors indicating a droop condition. In some embodiments the digital control sets the activation code as discussed with respect to the embodiment of FIG. 3 and additionally the number of voltage sensors indicating a droop condition. For example, in some embodiments the digital control sets the activation code to activate a percentage of power switches based on a percentage of voltage sensors indicating a droop condition.

Figure 5:
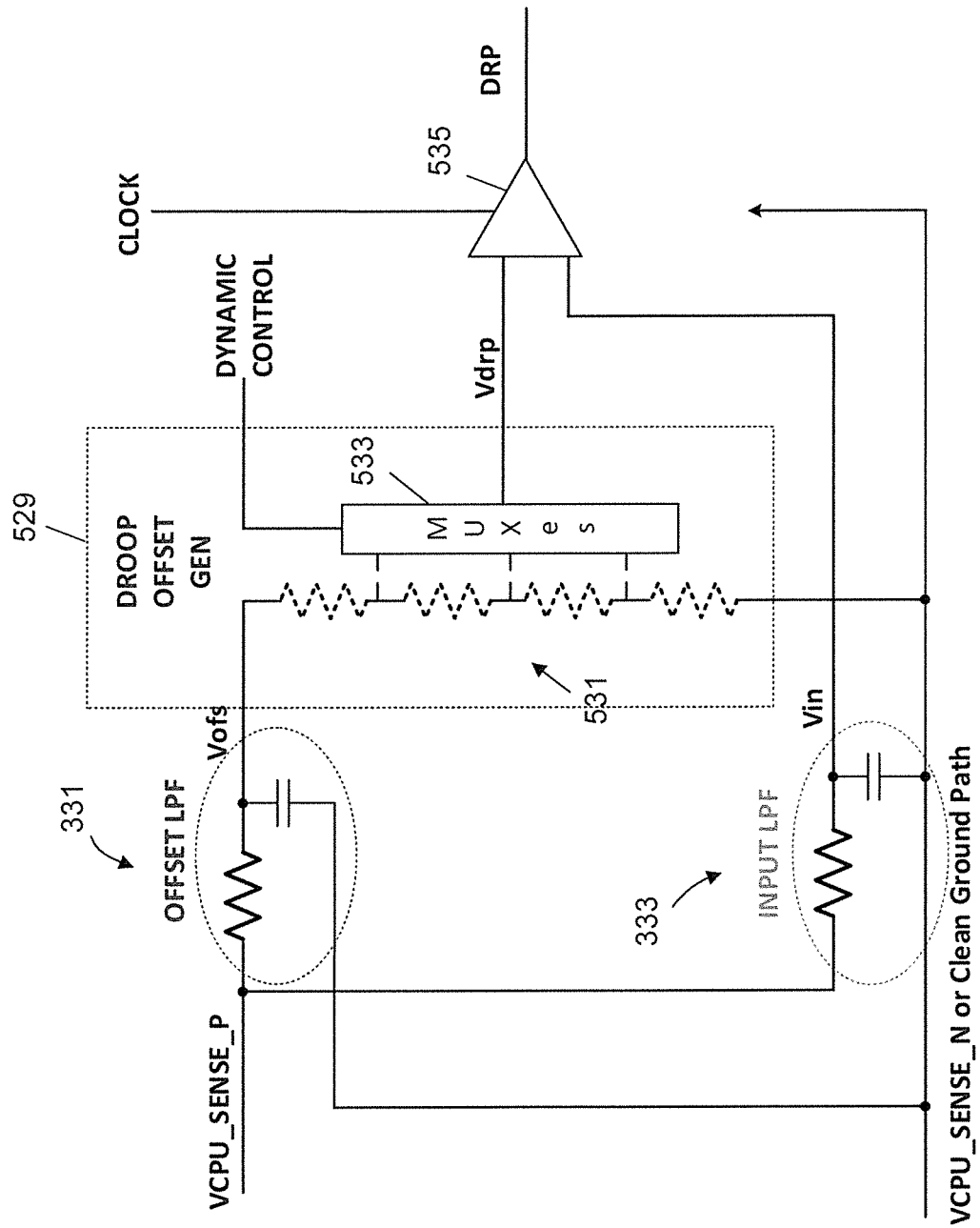
FIG. 5 is a semi-schematic semi-block diagram of example low-pass filters, droop offset generator, and single voltage sensor for an ATC block, in accordance with aspects of the invention.

FIG. 5 is a semi-schematic semi-block diagram of example low-pass filters, droop offset generator, and single voltage sensor for an ATC block, in accordance with aspects of the invention. In FIG. 5 an offset low-pass filter 331 and an input low pass filter 333 are shown, although it is noted that some embodiments additionally include a zero crossing low-pass filter. Each of the offset low-pass filter and the input low pass filter are shown as RC circuits. An input to the RC circuit is coupled to a CPU high power rail (or signal line indicative of voltage of the CPU high power rail) and the capacitor of the RC circuit is coupled to the CPU low power rail (or signal line indicative of voltage of the CPU low power rail), which might be ground (and is discussed as ground generally herein).

The output of the offset low-pass filter is provided as an input to a droop offset generator 529. The droop offset generator couples this input to a voltage divider 531, illustrated as a series of resistors coupled to ground. For illustrative purposes, the droop offset generator of FIG. 5 only outputs one Vdrp signal. The Vdrp signal is a voltage from the voltage divider selected by a multiplexer 533, with the selected voltage provided as a Vdrp signal to a voltage sensor 535 for comparison with the output of the input low pass filter. In the embodiment of FIG. 5, the voltage selected is dynamically selected as determined, for example, by a digital control, for example the digital control of FIGS. 2-4. The digital control may determine the selection based on, for example, a frequency of occurrence of voltage droops, an indication of a minimum voltage for which a CPU of a CPU cluster has been designed to operate without logic errors, or other factors. In some embodiments, and as illustrated in FIG. 3, the digital control sets a digital offset control signal, used by the droop offset generator in selecting the voltage provided as the Vdrp signal. In some embodiments the digital control sets the digital offset control signal to command use of a higher value for Vdrp, up to a predefined maximum value, for each cycle a droop situation exists. In some embodiments, the digital control offset signal is reset to command use of a minimum value for Vdrp, or simply a lower value, when the droop situation no longer exists.

Figure 6:
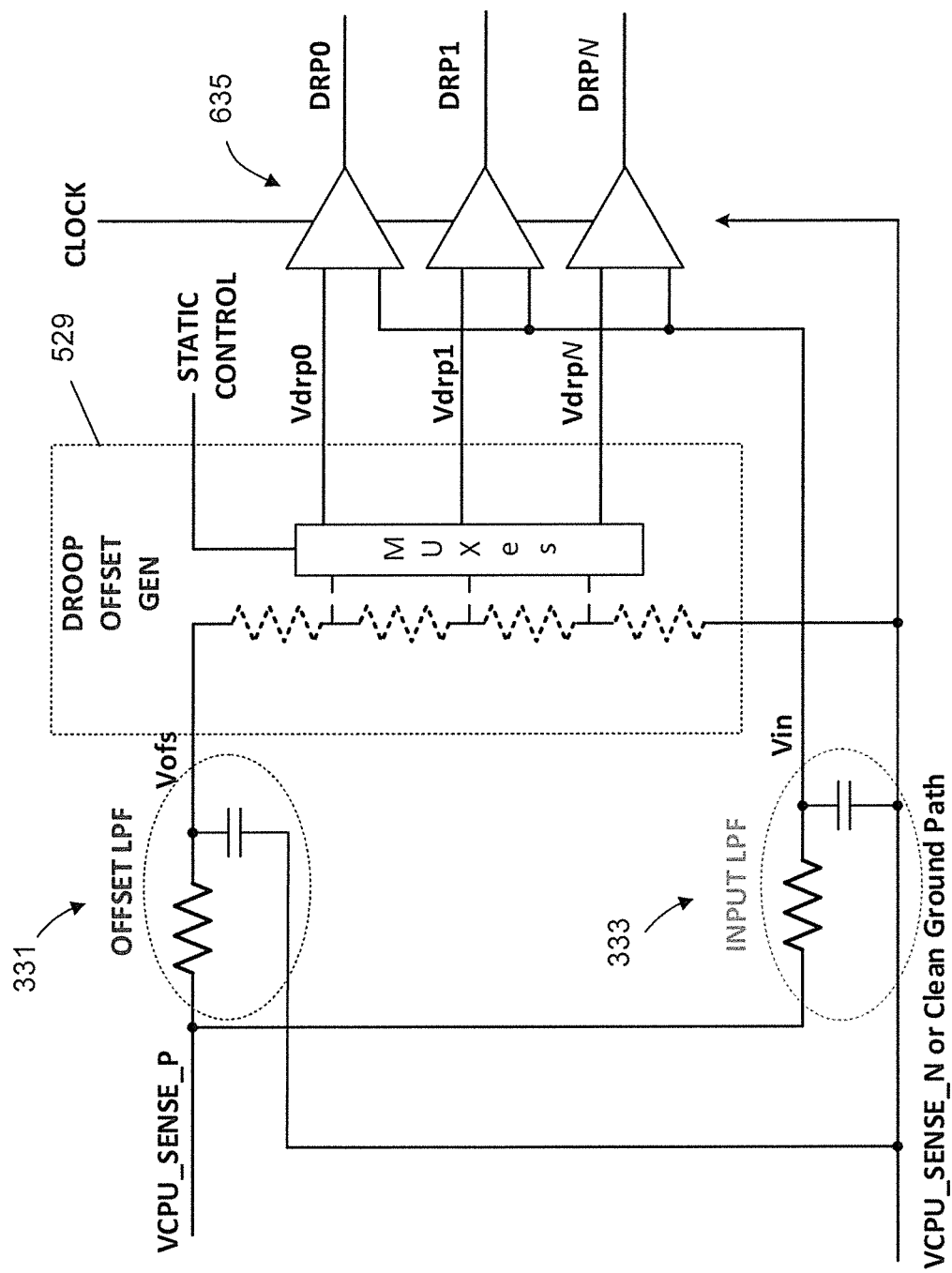
FIG. 6 is a semi-schematic semi-block diagram of a further example low-pass filters, droop offset generator, and voltage sensor array for an ATC block, in accordance with aspects of the invention.

FIG. 6 is a semi-schematic semi-block diagram of a further example low-pass filters, droop offset generator, and voltage sensor array for an ATC block, in accordance with aspects of the invention. The embodiment of FIG. 6 is similar to that of FIG. 5, with the offset low-pass filter 331, the input low-pass filter 333, and a droop offset generator 529. The droop offset generator 529 of the embodiment of FIG. 6, however, provides a plurality of voltage droop voltage levels, and correspondingly includes a plurality of voltage sensors 635 for comparing voltage droop voltage levels with an output of the input low-pass filter. In addition, the multiplexer of the embodiment of FIG. 6 is shown as being statically controlled.

Figure 7:
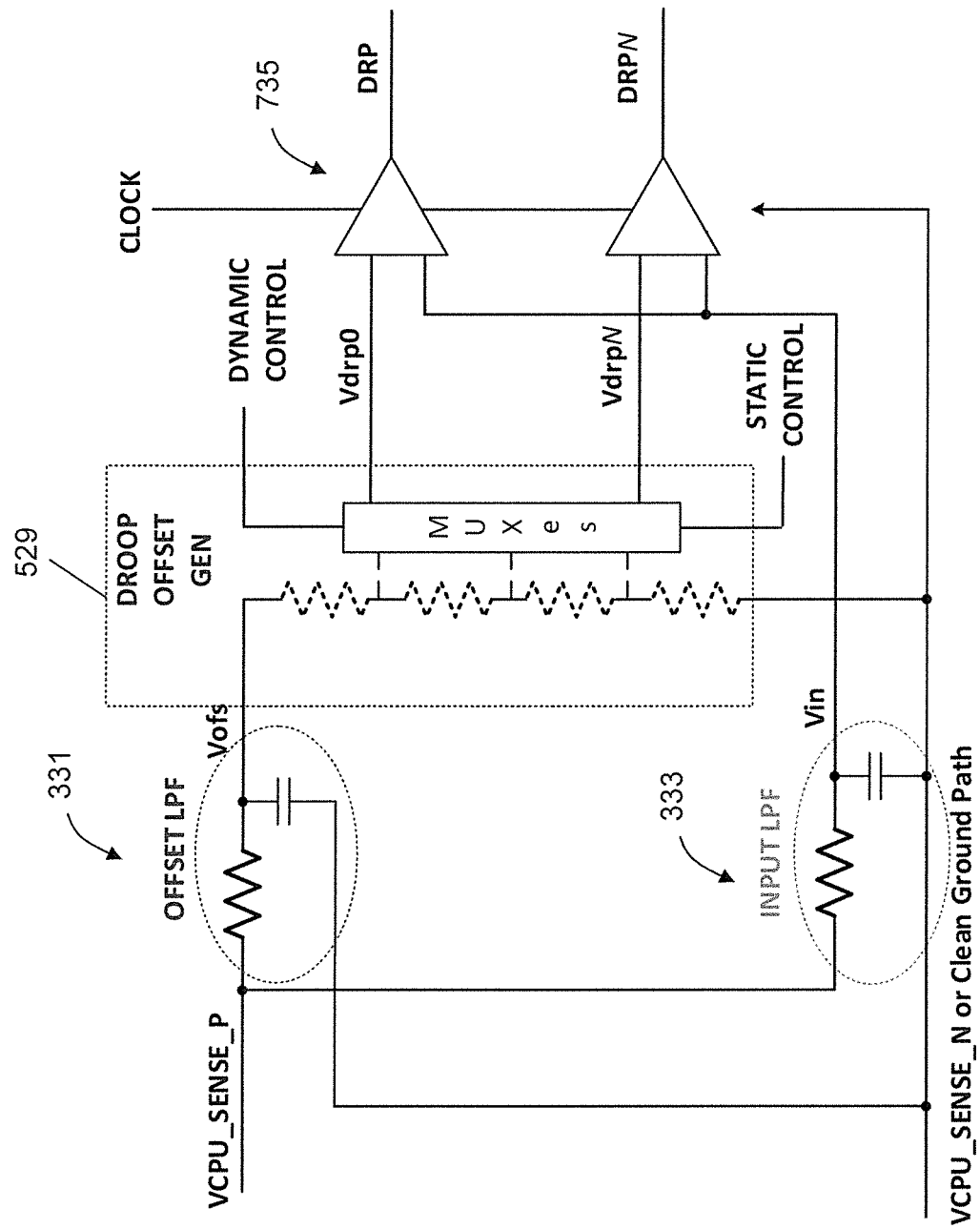
FIG. 7 is a semi-schematic semi-block diagram of a yet further example low-pass filters, droop offset generator, and voltage sensor array for an ATC block, in accordance with aspects of the invention.

FIG. 7 is a semi-schematic semi-block diagram of a yet further example low-pass filters, droop offset generator, and voltage sensor array for an ATC block, in accordance with aspects of the invention. The embodiment of FIG. 7 is the same as that of the embodiment of FIG. 6, other than the multiplexers of the droop offset generator being provided both dynamically and statically controlled. In some embodiments one of the droop signals is statically controlled, while others of the droop signals are dynamically controlled.

Figure 8:
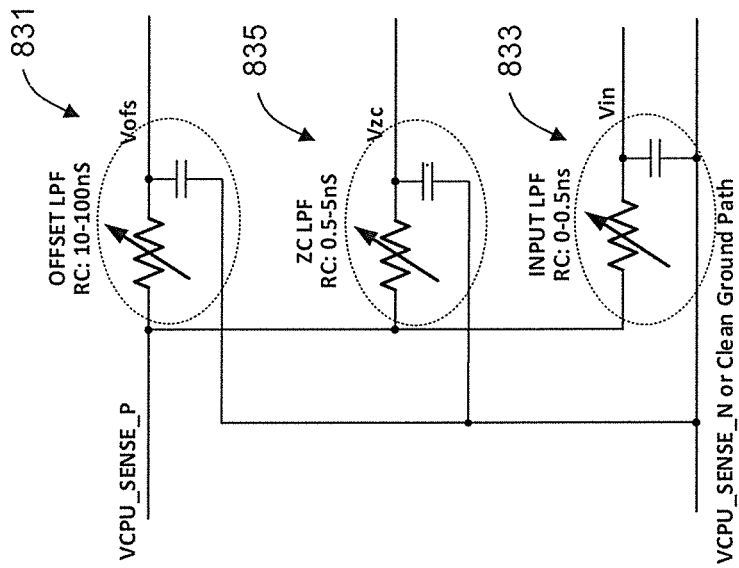
FIG. 8 is a schematic illustrating example low pass filters for use in an ATC block in accordance with aspects of the invention.

FIG. 8 is a schematic illustrating example low-pass filters for use in an ATC block in accordance with aspects of the invention. The embodiment of FIG. 8 shows an offset low-pass filter 831, a zero crossing low-pass filter 835, and an input low-pass filter 833. Each of the filters are implemented as RC circuits, with a variable resistance. In the embodiments illustrated in FIG. 8, a time constant of the offset low-pass filter may be varied between 10 and 100 nS, a time constant of the zero crossing low-pass filter may be varied between 0.5 and 5 nS, and a time constant of the input low-pass filter may be varied between 0 and 0.5 nS. Accordingly, an output of the offset low-pass filter will always be effectively delayed compared to an output of the input low-pass filter, and an output of the zero crossing low-pass filter will generally also be delayed compared to the output of the input low-pass filter, although the delay will be less than that provided by the offset low-pass filter.

FIG. 9 is a table indicating example output settings for droop sensors in accordance with aspects of the invention. In some embodiments. As indicated in the table of FIG. 9, droop sensors may indicate a trip condition based on comparisons of Vin, which may be the output of the input low-pass filter if present or an indication of voltage supplied to the CPU cluster if not present, with different droop threshold levels. In general, a trip, or activate condition, is indicated if Vin drops below the corresponding ones of the droop voltages provided to the voltage sensors. In addition, the table of FIG. 9 indicates that the trip conditions should be ignored or overridden if a comparison of Vin with the output of the zero crossing low-pass filter indicates that Vin is increasing. In various embodiments the ATC blocks discussed herein may utilize the table of FIG. 9 in determining operations of their digital control blocks.

Figure 10:
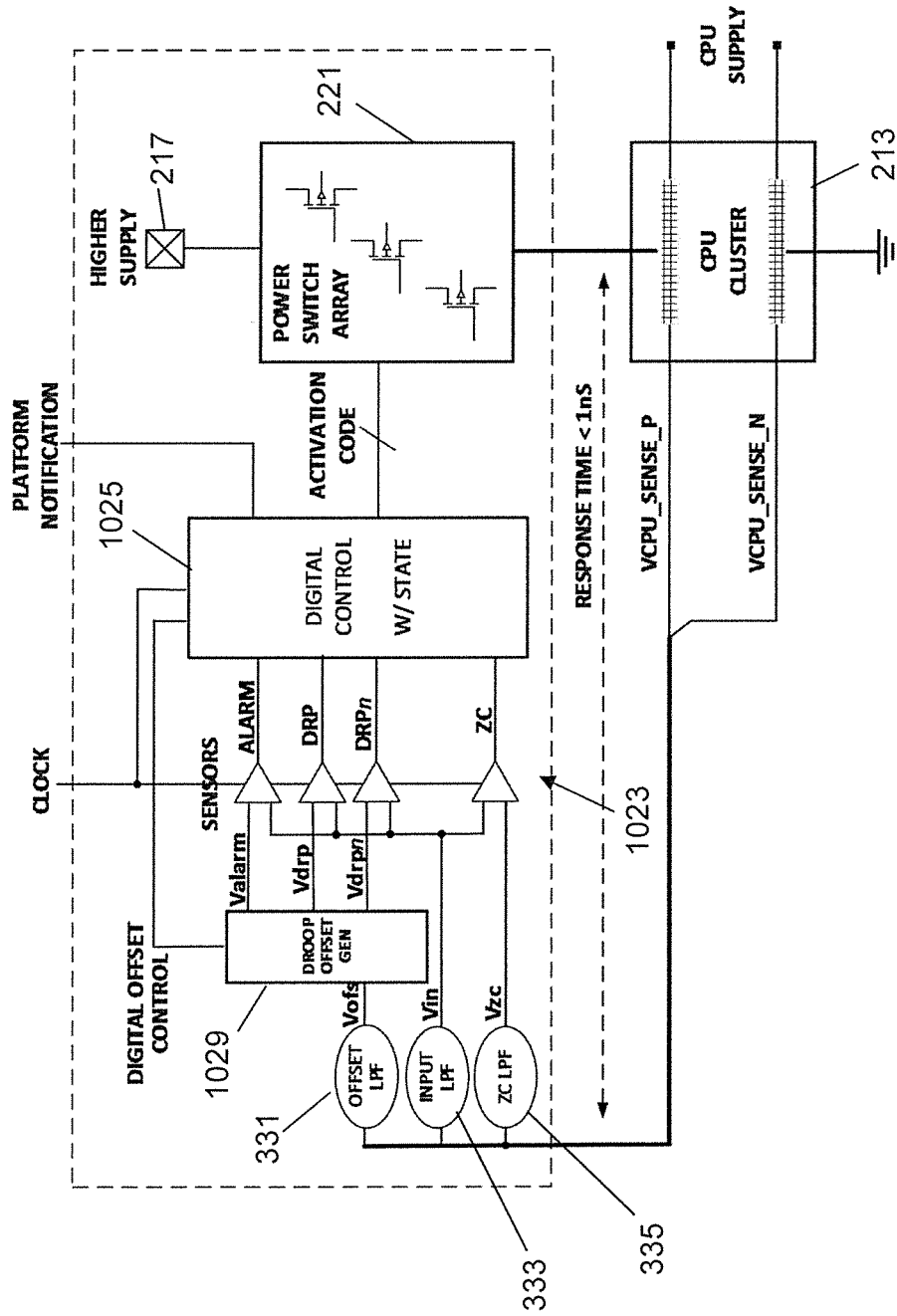
FIG. 10 is a block diagram of a further embodiment of an ATC block coupled to a load, in accordance with aspects of the invention.

FIG. 10 is a block diagram of a further embodiment of an ATC block coupled to a load, in accordance with aspects of the invention. The embodiment of FIG. 10 is similar to the embodiment of FIGS. 3 and 4, with the embodiment of FIG. 5 having a droop offset generator 1029 that provides only two voltage droop levels and corresponding changes to the voltage sensor array 1023.

In the embodiment of FIG. 10 the droop offset generator dynamically varies a first of the voltage droop levels, with a second of the voltage droop levels remaining statically fixed. In some embodiments the first of the voltage droop threshold levels is adjusted upward, for example in a step-wise fashion up to a predefined maximum, based on a signal from the digital control 1025 each cycle a voltage trip condition is indicated. Conversely, each cycle a voltage trip condition is not indicated, the signal from the digital control commands the voltage droop threshold level to be decreased, for example in a step-wise fashion down to a predefined minimum. In many embodiments the predefined minimum is above a voltage level set for the second of the voltage droop threshold levels.

Figure 11:
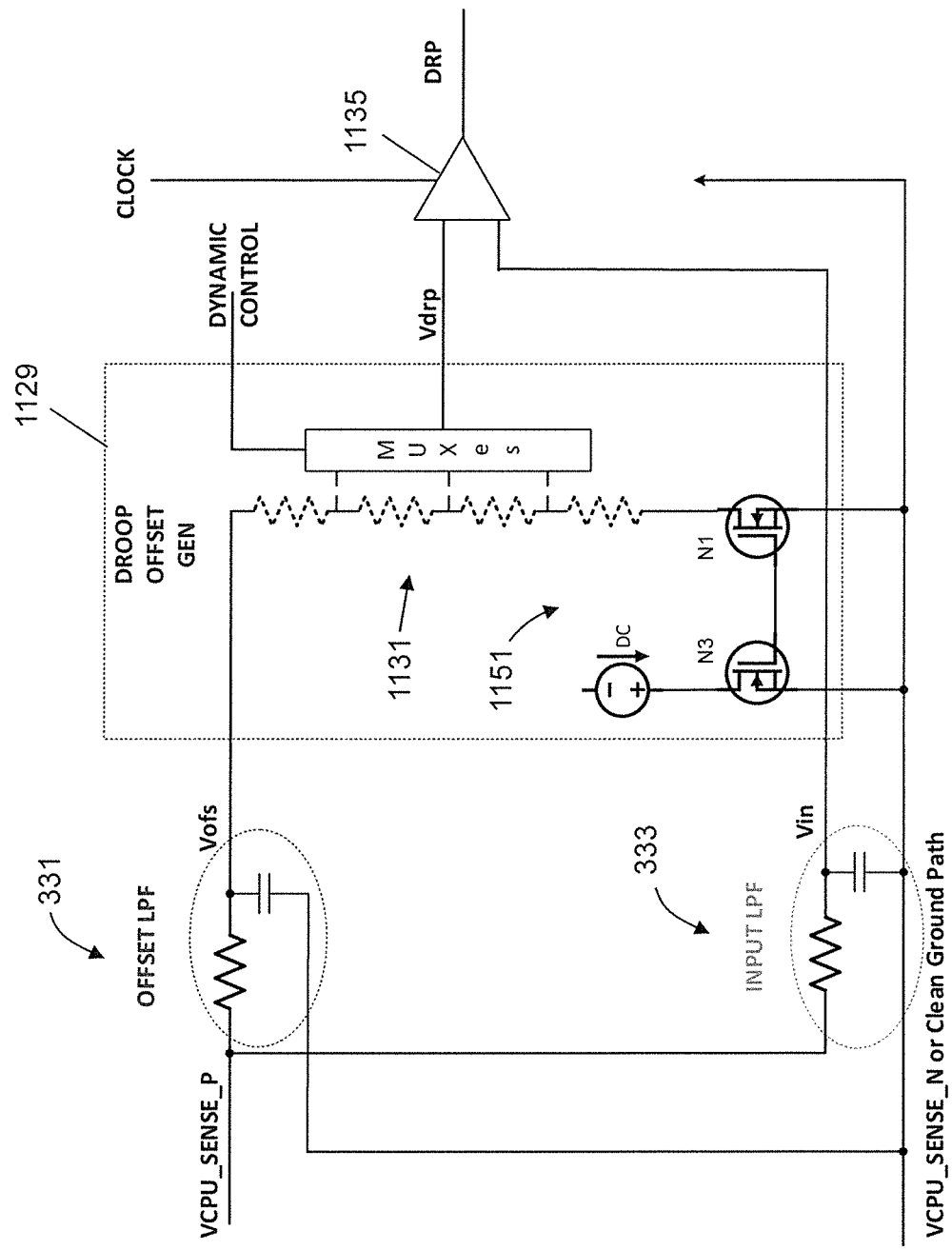
FIG. 11 is a semi-schematic semi-block diagram of an example low-pass filters, droop offset generator with current bias, and a single voltage sensor for an ATC block, in accordance with aspects of the invention.

FIG. 11 is a semi-schematic semi-block diagram of an example low-pass filters, droop offset generator with current bias, and a single voltage sensor for an ATC block, in accordance with aspects of the invention. The embodiment of FIG. 11 is the same as that of FIG. 5, except the droop offset generator 1129 of the embodiment of FIG. 11 utilizes a current mirror 1151 to provide a bias current for the voltage divider 1131, which it is noted may be implemented with either transistors or resistors for the resistances of the voltage divider.

Figure 12:
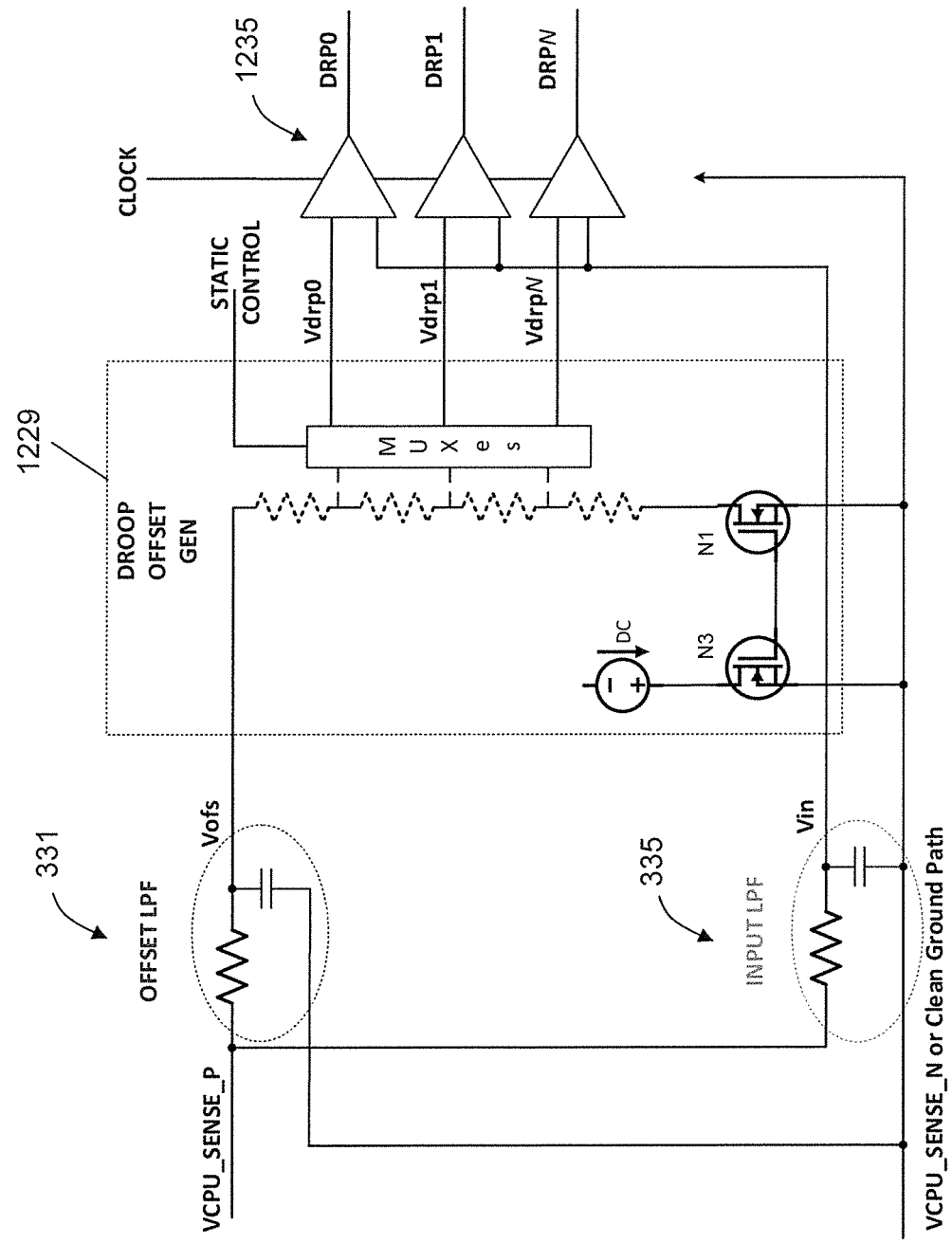
FIG. 12 is a semi-schematic semi-block diagram of a further example low-pass filters, droop offset generator with current bias, and a voltage sensor array for an ATC block, in accordance with aspects of the invention.

Similarly, FIG. 12 is also semi-schematic semi-block diagram of a further example low-pass filters, droop offset generator with current bias, and a voltage sensor array for an ATC block, in accordance with aspects of the invention. The embodiment of FIG. 12 corresponds to that of FIG. 6, with the droop offset generator 1229 of FIG. 12 making use of the current mirror discussed with respect to FIG. 11.

Figure 13:
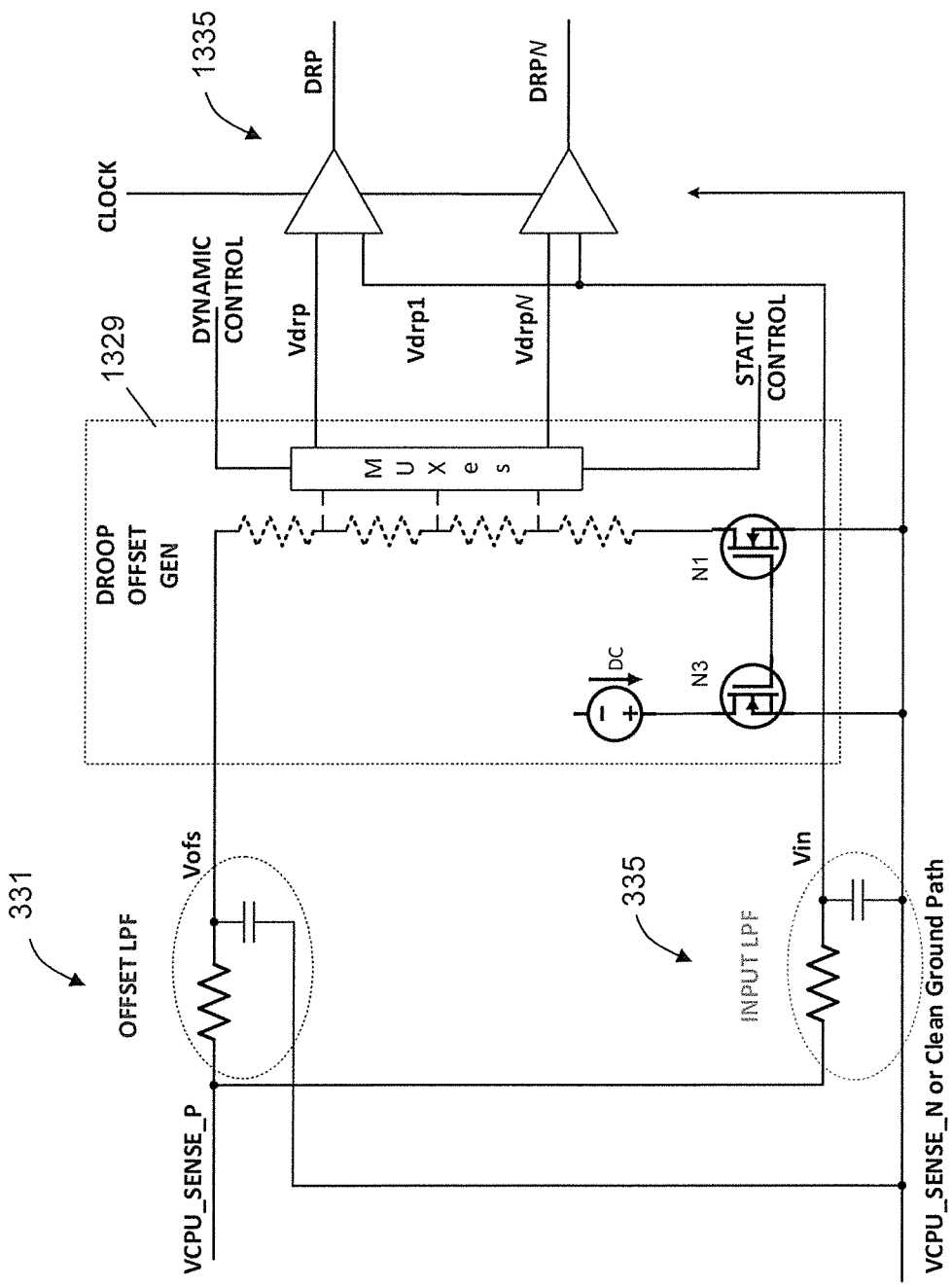
FIG. 13 is a semi-schematic semi-block diagram of a yet further example low-pass filters, droop offset generator with current bias, and a voltage sensor array for an ATC block, in accordance with aspects of the invention.

For completeness, FIG. 13 is also presented. FIG. 13 is a semi-schematic semi-block diagram of a yet further example low-pass filters, droop offset generator with current bias, and a voltage sensor array for an ATC block, in accordance with aspects of the invention. The embodiment of FIG. 13 corresponds to that of FIG. 7. As with the embodiment of FIG. 12, the droop offset generator 1329 of FIG. 13 makes use of the current mirror discussed with respect to FIG. 11.

Figure 14:
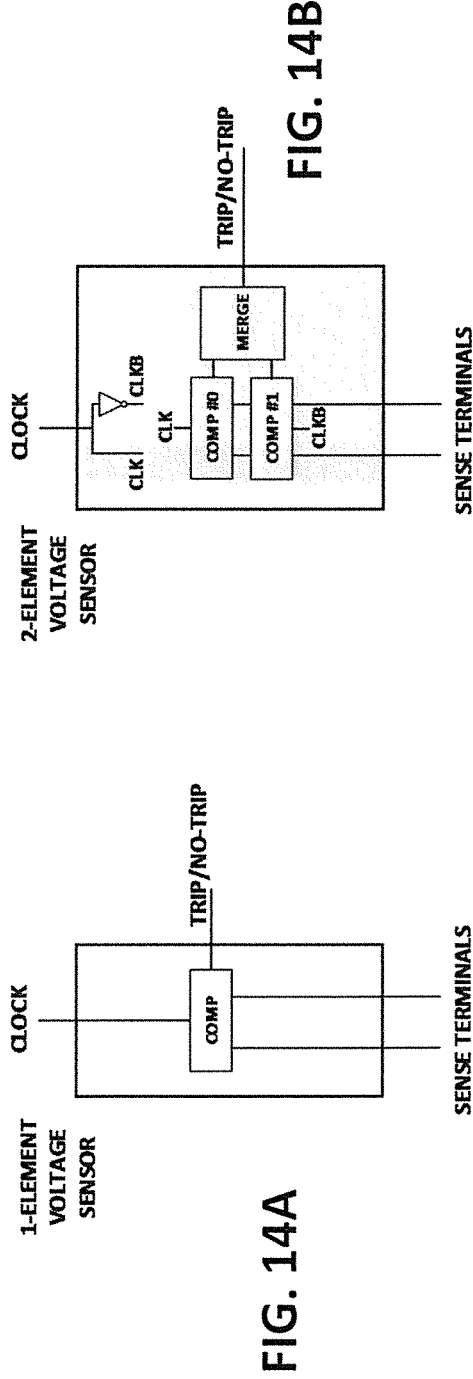
FIG. 14A-C illustrate embodiments of voltage sensors in accordance with aspects of the invention.

FIGS. 14A-C illustrate embodiments of voltage sensors in accordance with aspects of the invention. The embodiment of FIG. 14A includes a clocked comparator that outputs a result of a comparison of two inputs on a clocked basis. The embodiment of FIG. 14B includes two clocked comparators that outputs a result of a comparison of two inputs on a clocked basis, with the two comparators clocked using out of phase clock signals. Outputs of the two comparators are merged to provide a result of the comparisons. In some embodiments the merging operation is an OR operation, in some embodiments an AND operation, and in some embodiments an exclusive OR operation. More than two comparators may instead be used. For example, the embodiment of FIG. 14C includes n comparators, n greater than 2, with each of the n comparators clocked from different phases of a clock signal. The different phases of the clock signal may be provided, for example, by a multiphase PLL or DLL.

Figure 15:
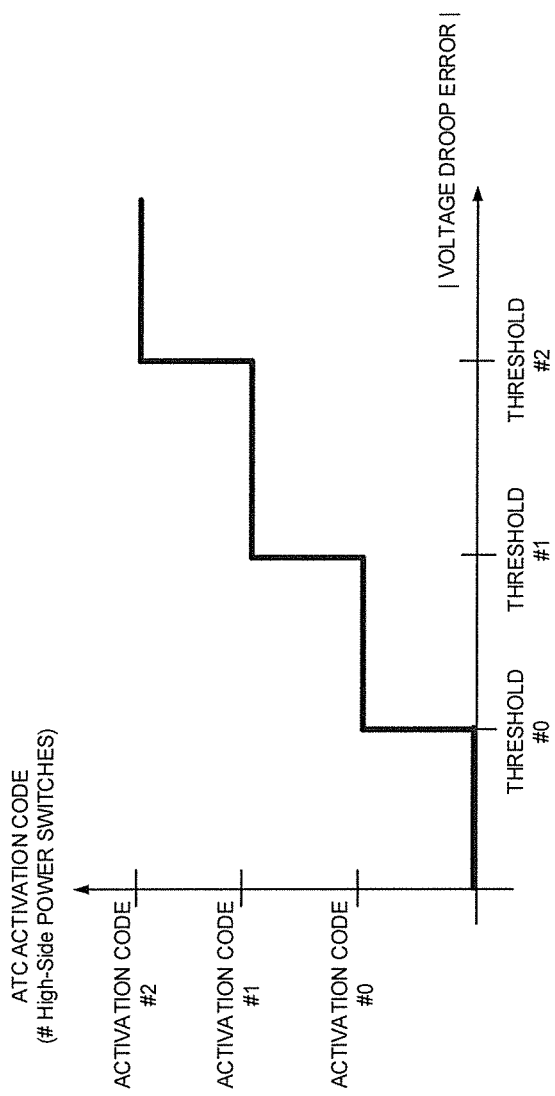
FIG. 15 is a graph of activation of power switches and voltage droop error, in accordance with aspects of the invention.

FIG. 15 is a graph of activation of power switches upon detection of voltage droop error, in accordance with aspects of the invention. The activation of power switches as indicated by FIG. 15 may be performed by the ATC blocks discussed herein. In FIG. 15, additional power switches are activated as a threshold is reached for each voltage droop level. In some embodiments a different activation code is provided for each voltage droop level, and the activation code may have a one-to-one correspondence with a number of power switches to be activated. For example, in some embodiments there may be three voltage droop levels, three corresponding activation codes, with each activation code activating different numbers of power switches. In some such embodiments the number of power switches activated may be a percentage of the power switches corresponding to the percentage of voltage droop levels for which the threshold has been exceeded.

Figure 16:
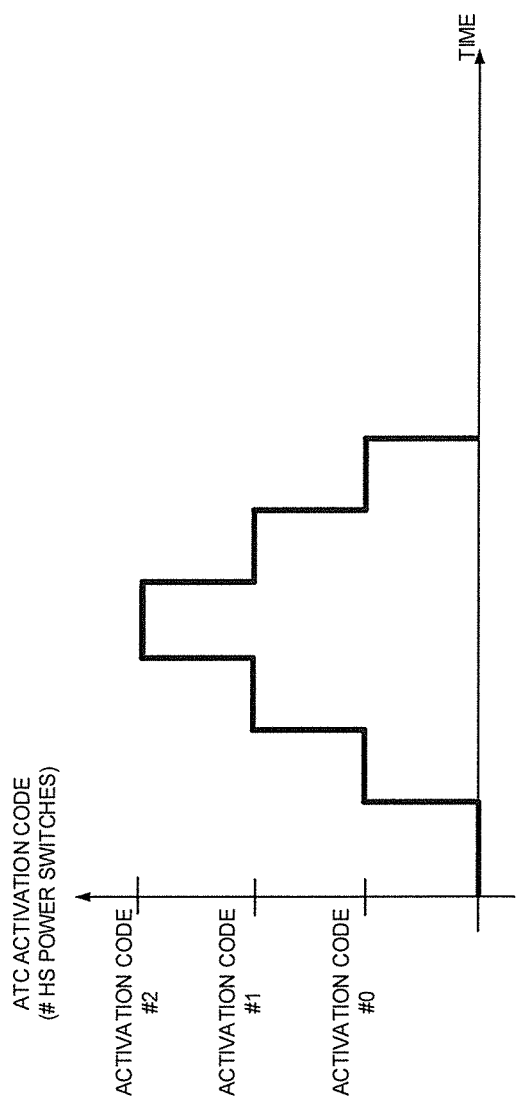
FIG. 16 is a further example graph of activation and deactivation of power switches in time upon a single full-magnitude droop event, in accordance with aspects of the invention.

FIG. 16 is a further graph of activation and deactivation of power switches upon detection of a voltage droop event, in accordance with aspects of the invention. The activation and deactivation of power switches as indicated by FIG. 16 may be performed by the ATC blocks discussed herein. The graph of FIG. 16 is similar to that of FIG. 15, but additionally shows reducing the activation code (and hence the number of power switches activated) as Vin increases and trip signals for voltage droop levels are deactivated. In FIG. 16, as each trip signal is deactivated, the activation code is decreased in a manner opposite to that of increase of the activation code, as discussed with respect to FIG. 15.

Figure 17:
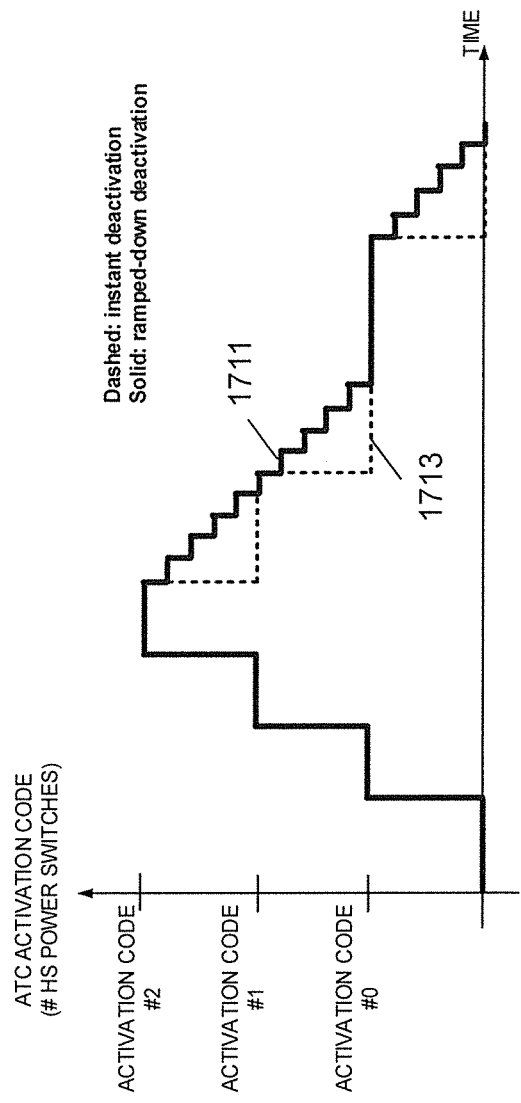
FIG. 17 is a further example graph of activation and ramped-down deactivation feature of power switches in time upon a single full-magnitude droop event, in accordance with aspects of the invention.

FIG. 17 is a further graph of activation and ramped-down deactivation feature of power switches upon detection of a voltage droop event, in accordance with aspects of the invention. In some embodiments it may be desirable to reduce a rate at which the power switches are deactivated, and FIG. 17 illustrates an example method of doing so. For FIG. 17, a plurality of power switches are associated with each increase or decrease in the activation code (or alternatively, the power switches each have a plurality of different possible states for passing different amounts of power). In FIG. 17, upon a reduction in the activation code, power switches are deactivated over time in a ramping manner, as illustrated by a solid line 1711, instead of deactivating all of the power switches for an activation code all at once, as illustrated by a dashed line 1713. As illustrated in FIG. 17, after a reduction of two levels of the activation code, the activation code is held for a period of time before the continuing reduction of the activation code for as long as a voltage droop event notification, is active for example in some embodiments a DRP0 signal (in the context of FIG. 4).

Figure 18:
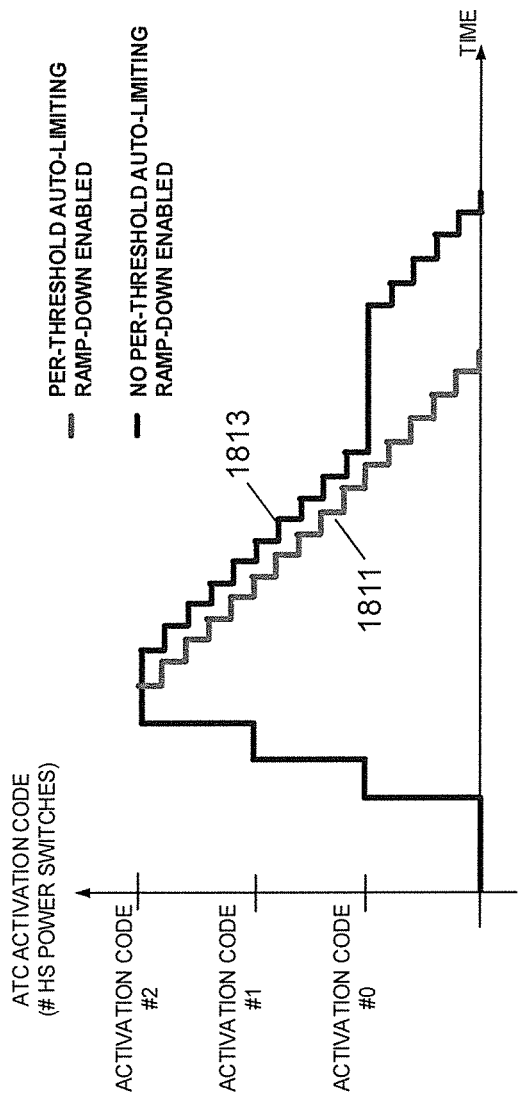
FIG. 18 is a further example graph of activation and ramped-down deactivation feature of power switches with a per-threshold auto-limiting feature in time upon a single full-magnitude droop event, in accordance with aspects of the invention.

FIG. 18 is a further graph of activation and ramped-down deactivation feature of power switches with a per-threshold auto-limiting feature upon a voltage droop event, in accordance with aspects of the invention. In some embodiments it may be desirable to limit a maximum consecutive time that power switches may be activated, or a maximum consecutive time that a predetermined number of power switches may be activated, or a maximum consecutive time that a particular number of power switches may be activated. In some embodiments the maximum time may be software configurable, and this may be done on a per level basis in some embodiments. In the example of FIG. 18, a maximum consecutive time that power switches may be activated is limited, and ramping down of activation of power switches begins at that time, regardless of the state of the comparisons with the voltage droop levels. FIG. 18 shows the ramping down 1811 of the switches based on the maximum consecutive time period being reached, along with the ramping down that would have otherwise occurred 1813 using the example of FIG. 17.

Figure 19:
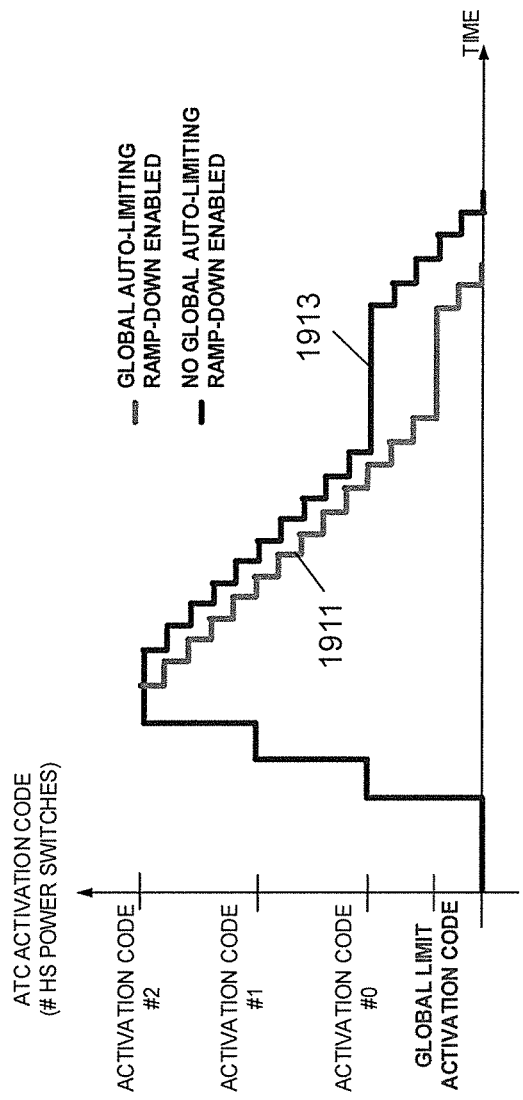
FIG. 19 is a further example graph of activation and ramped-down deactivation feature of power switches with a global auto-limiting feature in time upon a single full-magnitude droop event, in accordance with aspects of the invention.

FIG. 19 is a further graph of activation and ramped-down deactivation feature of power switches with a global auto-limiting feature upon a voltage droop event, in accordance with aspects of the invention. In some embodiments in which the per-threshold auto-limiting feature is utilized, it may be beneficial to retain some power switches in an active state, even if the maximum consecutive time limit has been reached, so long as one voltage droop level trip signal remains active. FIG. 19 indicates this (with a first line 1911), with a ramping down of activation of power switches stopped at what FIG. 19 terms a Global Limit Activation Code, and a ramping down without such a feature shown for comparison purposes (with a second line 1913).

Although the invention has been discussed with respect to various embodiments, it should be recognized that the invention comprises the novel and non-obvious claims supported by this disclosure.

What is claimed is:

1. Circuitry for compensating for voltage droop in power supplied to a load, comprising:
    a first low pass filter with a first time constant configured to filter a signal indicative of voltage provided to the load to provide a first low pass filtered signal;
    a second low pass filter with a second time constant configured to filter the signal indicative of voltage provided to the load to provide a second low pass filtered signal, the second time constant less than the first time constant;
    an offset generator configured to generate at least one voltage level that is a percentage of the first low pass filtered signal indicative of voltage provided to the load;
    a first sensor configured to determine that the second low pass filtered signal is less than the at least one voltage level; and
    control circuitry configured to activate at least one switch coupling a higher voltage source supply to the load in response to the first sensor determining that the second low pass filtered signal is less than the at least one voltage level.

2. The circuitry of claim 1, further comprising a third low pass filter with a third time constant, the third time constant less than the first time constant and greater than the second time constant, the third low pass filter configured to filter the signal indicative of voltage provided to the load to provide a third low pass filtered signal; and
    a second sensor configured to determine that the second low pass filtered signal is greater than the third low pass filtered signal;
    wherein the control circuitry is further configured to disable activation of the at least one switch coupling a higher voltage source supply to the load in response to the second low pass filtered signal being greater than the third low pass filtered signal.

3. The circuitry of claim 2, wherein the first time constant is 100 times the second time constant, and the third time constant is 10 times the second time constant.

4. The circuitry of claim 2, wherein each of the first low pass filter, second low pass filter, and third low pass filter include a variable resistance.

5. The circuitry of claim 1, wherein the offset generator is configured to generate additional voltage levels, each a different percentage of the first low pass filtered signal indicative of voltage provided to the load; and
    further comprising additional sensors, each configured to determine that the second low pass filtered signal is less than a corresponding one of the additional voltage levels; and
    wherein the at least one switch coupling the higher voltage source supply to the load comprises a plurality of switches; and
    wherein the control circuitry is configured to activate a number of the switches based on a number of the first sensor and additional sensors determining that the second low pass filtered signal is less than the at least one voltage level or the additional voltage levels.

6. The circuitry of claim 5, wherein the control circuitry is configured to disable the switches in a ramping manner over time.

7. The circuitry of claim 5, wherein the control circuitry is configured to activate at least some of the switches for at most a predetermined maximum consecutive time.

8. A method of compensating for voltage droop in power supplied to a load, comprising:
    determining that a signal indicative of voltage supplied to the load, to provide power to the load, is less than at least one predetermined percentage of a delayed version of the signal indicative of voltage supplied to the load;
    in response to determining that the signal indicative of voltage supplied to the load is less than the at least one predetermined percentage of the delayed version of the signal indicative of voltage supplied to the load, coupling a higher voltage source supply to a higher level voltage rail providing power to the load.

9. The method of claim 8, wherein the at least one predetermined percentage is a fixed percentage.

10. The method of claim 8, wherein the at least one predetermined percentage is a programmable percentage.

11. The method of claim 8, wherein the delayed version of the signal indicative of voltage supplied to the load comprises the signal indicative of voltage supplied to the load passed through a low pass filter.

12. The method of claim 8, wherein the signal indicative of voltage supplied to the load comprises a first signal from the higher level voltage rail passed through a first low pass filter, and the delayed version of the signal indicative of voltage supplied to the load comprises a second signal from the higher level voltage rail passed through a second low pass filter, and a time constant of the first low pass filter is less than a time constant of the second low pass filter.

13. The method of claim 8, wherein the at least one predetermined percentage of the delayed version of the signal indicative of voltage supplied to the load comprises a plurality of predetermined percentages, and wherein an extent of coupling of the higher voltage source supply to the higher level voltage rail is based on a number of instances for which the for which the signal indicative of voltage supplied to the load is less than various ones of the predetermined percentages of the delayed version of the signal indicative of voltage supplied to the load.

14. The method of claim 13, further comprising generating an activation code based on the number of instances for which the signal indicative of voltage supplied to the load is less than various ones of the predetermined percentages of the delayed version of the signal indicative of voltage supplied to the load, and wherein the activation code is used in activating switches coupling the higher voltage source supply to the higher level voltage rail.

15. The method of claim 14, further comprising determining that the signal indicative of voltage supplied to the load is greater than a further delayed version of the signal indicative of voltage supplied to the load, the further delayed version of the signal indicative of voltage supplied to the load being delayed less than the delayed version of the signal indicative of voltage supplied to the load, and, responsive thereto, disabling coupling of the higher voltage source supply to the higher level voltage rail.

16. The method of claim 14, wherein the activation code is also used in deactivating the switches coupling the higher voltage source supply to the higher level voltage rail.

17. The method of claim 16, wherein the switches are deactivated over time in a ramping manner.

18. The method of claim 17, wherein at least some of the switches are only activated for a predetermined maximum consecutive time.

\* \* \* \* \*